United States Patent [19]

Tokuda

[11] 4,150,309
[45] Apr. 17, 1979

[54] TRANSISTOR CIRCUIT HAVING A PLURALITY OF CONSTANT CURRENT SOURCES

[75] Inventor: Kazuo Tokuda, Tokyo, Japan
[73] Assignee: Nippon Electric Co., Ltd., Tokyo, Japan
[21] Appl. No.: 778,619
[22] Filed: Mar. 17, 1977
[30] Foreign Application Priority Data
Mar. 22, 1976 [JP] Japan ............................ 51-31021
[51] Int. Cl.² ........................................... H03K 17/00
[52] U.S. Cl. ................................ 307/310; 307/296 R; 307/294; 330/256
[58] Field of Search ................. 307/296, 297, 310; 330/256, 261; 323/1, 99, 22 T
[56] References Cited
U.S. PATENT DOCUMENTS
3,182,269  5/1965  Smith ................................... 330/256
3,970,947  7/1976  Sato et al. ............................ 330/261
4,019,071  4/1977  Ahmed .................................. 307/297

*Primary Examiner*—Stanley D. Miller, Jr.
*Assistant Examiner*—B. P. Davis
*Attorney, Agent, or Firm*—Hopgood, Calimafde, Kalil, Blaustein & Lieberman

[57] ABSTRACT

A transistor circuit having a plurality of constant current sources wherein a compensating resistor of a predetermined value is inserted between the base of the transistor of one of the constant current sources and a reference voltage supply terminal. The compensating resistor serves to equalize the current variation between currents flowing through first and second resistive loads and thereby equalizes D.C. circuit output potentials for the circuits being driven by the constant current sources. This equalization is achieved irrespective of variations in transistor current gain due to temperature fluctuation or manufacturing error.

7 Claims, 5 Drawing Figures

TRANSISTOR CIRCUIT HAVING A PLURALITY OF CONSTANT CURRENT SOURCES

FIELD OF THE INVENTION

This invention relates to a transistor circuit having a plurality of constant current sources, and more particularly to a transistor circuit which includes a plurality of circuit portions each portion being connected to a respective constant current source wherein the D.C. potential at an output terminal of each circuit portion is required to be accurately controlled.

BACKGROUND OF THE INVENTION

A typical example of a circuit in accordance with the prior art is a color demodulator circuit in a color television receiver. This circuit includes three circuit portions which respectively demodulate color signals of red, blue and green components. The demodulator circuit further includes constant current sources, and each of the demodulating circuit portions is connected to the respective constant current sources. Each demodulating circuit portion has an output terminal from which a demodulated color signal is derived, and the D.C. potential at the output terminals of the three demodulating circuit portions is required to be the same so that highly accurate color reproduction, notably reproduction of white colors, can be secured on a screen of the color television receiver. This requirement must be met, in the prior art, by controlling relative values of the output currents of the respective constant current sources. However, it is quite difficult to accurately control the relative values of the output currents of prior art constant current sources, as is detailed hereinafter.

The relative values of the output currents, in the prior art, are determined by the value of the current gain $\alpha$, or its factorial, of the transistor or transistors in the respective circuit portions connected to the constant current sources. However, since the current gain $\alpha$ is 0.98–0.99, i.e., nearly equal to unity, accurate control of the relative output current values is very hard and is not suited to mass-production techniques. This is especially true where the circuit is realized as a semiconductor integrated circuit. In such a circuit reliziation, accurate control is impossible. In addition, even if accurate control of the relative values of the output currents can be achieved for one specific value of the current gain $\alpha$, the controlled relationship of the output D.C. potentials will be lost with variations of the current gain $\alpha$ due to operating temperature fluctuation or manufacturing error.

Difficulties similar to those just described will also occur in the circuit of a direct-coupled amplifier, direct-coupled modulator, direct-coupled demodulator or other circuits which generate two or more outputs and require the accurately controlled output D.C. potentials.

It is therefore a principle object of the present invention to provide a transistor circuit generating at least two output potential having accurately controlled D.C. currents.

It is another object of the present invention to provide a transistor circuit, having two or more constant current sources and generating two or more output potentials, having D.C. currents, the relation of which, is maintained irrespective of the current gain $\alpha$ of transistors employed.

It is still another object of the present invention to provide a transistor circuit including two or more circuit portions, each connected to a respective constant current source and generating outputs having the same D.C. potential irrespective of the current gain $\alpha$ of the transistor employed in the circuit portion.

SUMMARY OF THE INVENTION

According to the present invention, there is provided a transistor circuit comprising:
 a power supply terminal;
 a reference constant voltage supply terminal;
 a first constant current source having a first transistor with a base connected to said reference constant voltage supply terminal, an emitter connected to a common potential by way of a first resistor, and a collector generating a first constant current;
 a first circuit portion including a series connection of a third transistor connected to the collector of the first transistor and a first resistive load connected to the power supply terminal;
 a second constant current source having a second transistor with an emitter connected to the common potential by way of a second resistor, a collector generating a second constant current, and a base connected by way of a third resistor to said reference voltage supply terminal; and
 a second circuit portion including a second resistive load connected between the collector of the second transistor and the power supply terminal.

It is a feature of the invention that a compensating resistor is inserted between the base of the transistor of one of the constant current sources and the reference voltage supply terminal.

In accordance with the invention, one or more transistors may be inserted in a series-connection relationship between the thid transistor of the first circuit portion and the collector of the first transistor. Further, one or more series-connected transistors may be inserted between the second resistive load of the second circuit portion and the collector of the second transistor, provided that the number of the inserted transistor or transistors is less than that of the series-connected transistors in the first circuit portion. The resistance of the compensating resistor is determined so as to equalize the variation of the currents flowing through the first and second resistive loads. Such variation is caused by operating temperature fluctuation or manufacturing error.

It is another feature of the invention that in the case where the difference "K" in the number of transistors between the first and second circuit portions, is equal to 3, the resistance of the compensating resistor is selected so as to be "K" times as large as the resistance of the second resistor.

According to another aspect of the present invention, as will be described in more detail hereinafter, D.C. currents flowing through the first and second resistive loads may be equally affected from the first and second circuit portions irrespective of the difference in numbers of the series-connected transistors in these circuit portions. Therefore the relation of these currents is kept uniform irrespective of the variation of the current gain $\alpha$ of the transistor due to temperature fluctuation or manufacturing error.

It is a further feature of the invention that in the case where the resistances of the first and second resistors in the first and second constant current sources are designed to be equal to each other and where the resistances of the first and second resistive loads in the first and second circuits are designed to be equal to each other, the same D.C. voltage drop appears across the first and the second resistive loads irrespective of the variation of the current gain $\alpha$ due to temperature fluctuation or manufacturing error.

It is another feature of the invention that the resistance of the compensating resistor may be set to be an integral number of times as large as that of the second resistor, so that the circuit arrangement may be simplified. Although difficulty is encountered with adjustment of an absolute value, of a resistance in a semiconductor integrated circuit, it is quite easy to multiply a ratio of resistance an integral number of times, so that the present invention may be readily practiced in a semiconductor integrated circuit.

The above and other objects and features of the invention will become apparent from the following description taken in conjunction with the accompanying drawings, wherein.

DETAILED DESCRIPTION

Figure 1:
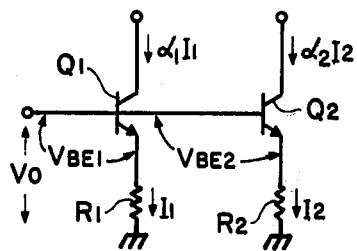
FIG. 1 is a circuit diagram showing prior art constant current sources.

FIG. 1 shows one typical example of the prior art constant current sources used in an integrated circuit, which includes transistors $Q_1$ and $Q_2$ and emitter resistors $R_1$ and $R_2$. D.C. constant voltage $V_0$ is impressed on the bases of the transistors $Q_1$ and $Q_2$ to obtain constant currents at their collectors.

Satisfactory matching of the electrical characteristics between elements may be achieved in a semiconductor integrated circuit having elements formed on the same semiconductor substrate. For instance, in the case where resistances $r_1$ and $r_2$ of the emitter resistors $R_1$ and $R_2$ are equal to each other, then base-emitter voltages $V_{BE1}$ and $V_{BE2}$ and the current gains $\alpha_1$ and $\alpha_2$ of the transistors $Q_1$ and $Q_2$ may be taken as being equal to each other, so that collector currents of the transistors $Q_1$ and $Q_2$ will be equalized and may be expressed as follows:

$$\alpha_1 = \alpha_2 I_2 = \alpha(V_0 - V_{BE})/r_1 \qquad (1)$$

wherein $$V_{BE1} = V_{BE2} = V_{BE} \alpha_1 = \alpha_2 = \alpha$$

Constant current sources which generate two well balanced currents due to the matching of elements in such an integrated circuit find an application in a direct-coupled amplifier, a modulating circuit or a demodulating circuit which requires a highly controlled D.C. output potential, with the aid of a differential amplifier, resistance loads, and the like.

Figure 2:
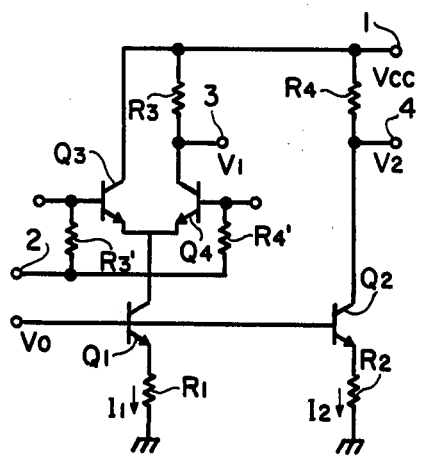
FIG. 2 is a circuit diagram showing a differential amplifier with the prior art constant current sources of FIG. 1.

FIG. 2 shows a prior art example of the constant current sources of FIG. 1, which are applied to a direct-coupled differential amplifier. In FIG. 2, a collector of a transistor $Q_1$ is connected to a common emitter of transistors $Q_3$ and $Q_4$, while a collector of the transistor $Q_3$ is connected to a power supply terminal 1, and a collector of the transistor $Q_4$ is connected by way of a load resistor $R_3$ to the power supply terminal 1. In addition, the bases of transistors $Q_3$, $Q_4$ are connected by way of resistors $R_{3''}$ and $R_{4''}$ to a base bias terminal 2, respectively, thereby constituting a differential amplifier. The collector of the transistor $Q_2$ is connected by way of resistor $R_4$ to the power supply terminal. The first and second output terminals 3 and 4 are connected to the collectors of the transistor $Q_4$ and $Q_2$, respectively. An input signal is applied across the base terminals of transistors $Q_3$ and $Q_4$, and then derived from the output terminal 3. An output terminal D.C. potential $V_1$ at the time of absence of the input signal may be given by the following equation, assuming that the transistors $Q_3$ and $Q_4$ are maintained in equalibrium, and current gains thereof are equally $\alpha$, as in the case of the transistors $Q_1$ and $Q_2$:

$$V_1 = V_{cc} - \frac{\alpha^2 \cdot I_1 \cdot r_3}{2} \qquad (2)$$

wherein $V_{cc}$ is a voltage applied to the power supply terminal 1. As can be seen from the equation (2), the output terminal D.C. potential $V_1$ is dependent on the potential drop between the opposite ends of the load resistors $R_3$ due to an output current of $\alpha^2 I_1/2$, which has been influenced by base currents of the transistors $Q_1$ and $Q_4$.

Turning to the other constant current source, the collector of the transistor $Q_2$ is connected by way of a load resistor $R_4$ to the power supply terminal 1, thereby supplying an output D.C. potential $V_2$ to an output terminal 4. Assume that a resistance $r_3 = 2r_4$, so that the output D.C. potentials $V_1$ and $V_2$ at the terminals 3, 4 may be nearly equal to each other, then the output D.C. potential $V_2$ is given as follows:

$$V_2 = V_{cc} - \alpha I_2 r_4 = V_{cc} - \frac{\alpha I_2 r_3}{2} \qquad (3)$$

In case a difference between the output D.C. potentials $V_1$ and $V_2$ is used as an output voltage, a null voltage is required for the aforesaid difference voltage, and in case the output terminals 3, 4 are directly coupled to the subsequent circuit, a highly accurate adjustment is required for the aforesaid difference voltage.

From the equations (2), (3), $$V_2 - V_1 = \frac{\alpha \cdot r_3}{2}(I_2 - \alpha I_1) \qquad (4)$$

As in an example of FIG. 1, $I_2 = I_1$, then the equation (4) is given by:

$$V_2 - V_1 = \frac{\alpha \cdot I_1 r_3}{2}(1 - \alpha) \qquad (5)$$

There may be obtained a difference voltage due to $(1 - - \alpha)$ which is a difference of current gain $\alpha$ of the transistor from "1."

One attempt for reducing a difference voltage to zero is that a difference is given to the resistances $r_1$ and $r_2$ of the emitter resisstors $R_1$ and $R_2$ in a constant current source, beforehand, so that $I_2 - \alpha I_1 = 0$. In this case, a difference of $V_{BE}$ due to a difference in emitter currents may be essentially neglected, and thus the resistances are set to $r_2 = r_1/\alpha$. However, in this attempt, even if the aforesaid prerequisite is satisfied at a given value of the current gain $\alpha$, the aforesaid prerequisite can no longer be satisfied, when $\alpha$ fluctuates. As a result, this attempt can not sufficiently compensate for variations due to manufacturing error or a variation of $\alpha$ due to the temperature-dependency thereof. These variatons are inevitable in the semiconductor intergrated circuits. Further, since the current gains in general fall in a range of 0.98 to 0.99, it is quite difficult to derive a resitance ratio, $r_1 r_2 = \alpha$, with high accuracy.

Figure 3:
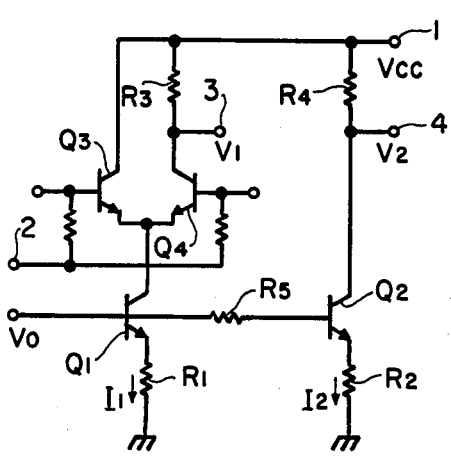
FIG. 3 is a circuit diagram showing a differential amplifier with constant current sources according to a first embodiment of the invention.

FIG. 3 shows a first embodiment, in which the present invention is applied to the case of FIG. 2. A resistor $R_5$ is additionally inserted between the source of the D.C. constant voltage $V_0$ and the base of the transistor $Q_2$ in the circuit of FIG. 2. A base current $(1-\alpha)I_2$ of the transistor $Q_2$ flows through the resistor $R_5$ (resistance $r_5$), so that an equation for constant currents $I_1$ and $I_2$ is given as follows:

$$V_0 = V_{BE1} + I_1 r_1 = V_{BE2} + (1-\alpha)I_2 r_5 + I_2 r_2 \ldots \quad (6)$$

Assume that $r_1 = r_2$, then a difference between base-emitter voltages $V_{BE1}$ and $V_{BE2}$, due to a difference between $I_1$ and $I_2$, may be neglected, so that equation (6) may be simplified into the following equation (6'):

$$I_2 r_1 = I_1 r_1 - (1-\alpha)I_2 r_5 \quad (6')3$$

Assume that the resistance $r_5$ of the resistor $R_5$ is $r_5 = I_1/I_2 \, r_1$, then the equation (6') will be $I_2 = \alpha I_1$. This means that the relation $I_2 - \alpha I_1 = 0$ is realized and the aforesaid equation (4) is kept to zero. The above relationship may be established, irrespective of the fluctuation in absolute value of a current gain $\alpha$, as long as the current gains $\alpha$ of the respective transistor constituting the circuit of FIG. 3 are all equal to each other, with the result that a difference voltage between the output D.C. voltages $V_1$ and $V_2$ may be nullified, irrespective of the value of current gain $\alpha$ of the transistor. The condition $r_5 = I_1/I_2 \times r_1 = 1/\alpha r_1$ may be approximated to $r_5 = r_1$, so that resistances $r_1$, $r_2$ and $r_5$ of the resistors $R_1$, $R_2$ and $R_5$ may be made equal. In addition, uniformity in electrical characteristics of elements in a semiconductor integrated circuit may be easily attained, so that the difference voltage may be easily nullified, irrespective of a variation in current gain $\alpha$ of transistors in the integrated circuit due to manufacturing error, or fluctuation of electrical characteristics due to temperature dependency, as has been described earlier. The resistances $r_1$, $r_2$ and $r_5$ are only required to be equal, which can be easily met when manufacturing a semiconductor integrated circuit.

Figure 4:
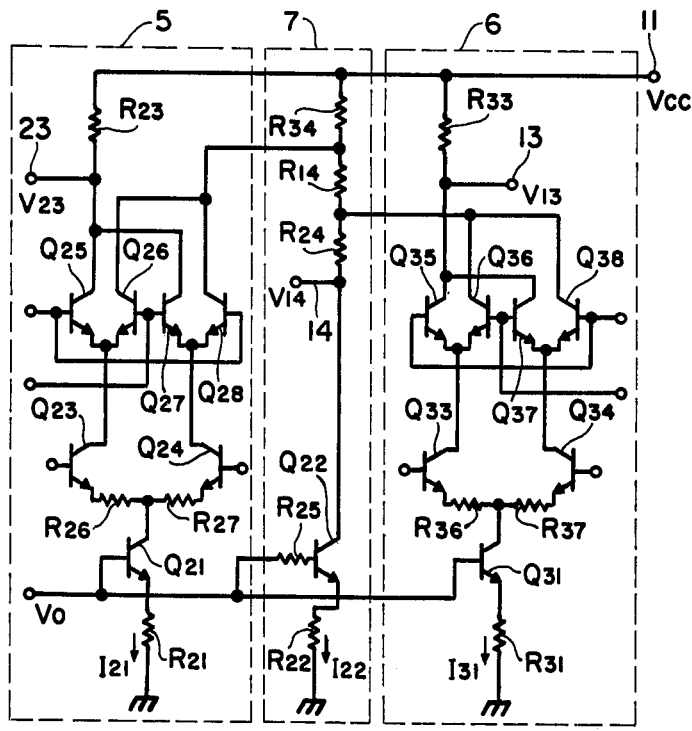
FIG. 4 is a circuit diagram showing a color demodulator circuit for a color television receiver including constant current sources according to a second embodiment of the invention.

FIG. 4 shows a circuit diagram of a second embodiment of the present invention, in which the present invention is applied to color demodulation circuits in a color television receiver. In FIG. 4, there is illustrated a power source terminal 11, supplying a power voltage $V_{cc}$, an (R-Y) demodulation circuit block 5, consisting of transistors $Q_{21}$ and $Q_{23}$ L to $Q_{28}$, and resistors $R_{21}$, $R_{23}$, $R_{26}$ and $R_{27}$, a (B-Y) demodulation circuit block 6, consisting of transistors $Q_{31}$ and $Q_{33}$ to $Q_{38}$, and resistor $R_{31}$, $R_{33}$, $R_{36}$ and $R_{37}$, (G-Y) demodulation circuit block 7, consisting of transistors $Q_{22}$, and resistors $R_{22}$, $R_{25}$, $R_{14}$, $R_{24}$ and $R_{34}$, an (R-Y) demodulated signal output terminal 23, a (B-Y) demodulated signal output terminal 13, and a (G-Y) demodulated signal output terminal 14. D.C. constant voltage $V_0$ is impressed on transistors $Q_{21}$, $Q_{22}$ and $Q_{31}$, respectively, thus serving as constant current source for producing constant currents from the collectors of the above transistors. Emitters of transistors $Q_{23}$ and $Q_{24}$ are connected to the collector of transistor $Q_{21}$ by way of emitter resistors $R_{26}$ and $R_{27}$ and emitters of transistors $Q_{33}$ and $Q_{34}$ are conected to the collector of transistor $Q_{31}$ by way of emitter resistors $R_{36}$ and $R_{37}$. Transistors $Q_{23}$ and $Q_{24}$ and transistors $Q_{33}$ and $Q_{34}$ constitute first differential amplifiers, respectively. A carrier chrominance signal is applied across the bases of transistors $Q_{23}$ and $Q_{24}$ as well as across the bases of transistors $Q_{33}$ and $Q_{34}$. Connected to the collectors of the transistors $Q_{23}$ and $Q_{24}$ is a second stage differential amplifier consisting of transistors $Q_{25}$, $Q_{26}$, $Q_{27}$ and $Q_{28}$, as well as the collectors of the transistors $Q_{33}$ and $Q_{34}$ to another second stage differential amplifier consisting of transistors $Q_{35}$, $Q_{36}$, $Q_{37}$ and $Q_{38}$, so that the aforesaid carrier chrominance signal may be demodulated by a reference signal. The color difference signals thus demodulated are derived through output terminals 23 and 13 from one end of each of load resistors $R_{23}$ and $R_{33}$. More particularly, an (R-Y) demodulation output signal having a D.C. potential $V_{23}$ is derived at the outut terminals 23, while a (B-Y) demodulation signal having a D.C. potential $V_{13}$ is derived from the output terminal 13. On the other hand, the other outputs of the second stage differential amplifiers are impressed on the junctions of resistors $R_{14}$, $R_{34}$ and $R_{24}$, connected in series to a collector of the transistor $Q_{22}$, so that these outputs are synthesized, and then a (G-Y) demodulation output signal having a D.C. potential $V_{14}$ is derived from the output terminal 14. A resistor $R_{25}$ is inserted so as to equalize the D.C. potentials of output terminals 23, 13 and 14 with each other, as will be described in detail hereinafter. In the color demodulator in FIG. 4, one of the functions required is to maintain equality between the D.C. potentials at the three output terminals 23, 13 and 14. However, this functon directly effects the color reproduction, particularly white reproduction on a screen of a color television receiver, so that equality of the D.C. potentials of an extremely high accuracy is required. A.D.C. potential $V_{23}$ at the (R-Y) output terminal 23 and a D.C. potential $V_{13}$ at the (B-Y) output terminal 13 may be given by the following equation, assuming that the current gains of transistors in the circuit are all equal to a gain $\alpha$, the resistances of the resistors $R_{23}$ and $R_{33}$ are $r_{23}$ and $r_{33}$, respectively, and currents flowing through the resistors $R_{21}$ and $R_{31}$ are $I_{21}$ and $I_{31}$, respectively:

$$V_{23} = V_{cc} - \frac{\alpha^3 \cdot I_{21} \cdot r_{23}}{2} \quad (7)$$

$$V_{13} = V_{cc} - \frac{\alpha^3 \cdot I_{31} \cdot r_{33}}{2} \quad (8)$$

In case the respective resistances $r_{21}$ and $r_{31}$ of the emitter resistors $R_{21}$ and $R_{31}$ are set to be equal to each other so as to provide the relationships $r_{23} = r_{33}$, and $I_{21} = I_{31}$, then $V_{23} = V_{13}$ may be maintained.

A D.C. potential $V_{14}$ at the (G-Y) output terminal 14 may be given by the following equation for D.C. potentials at the output terminals 23 and 13 under the condition $I_{21} = I_{31}$:

$$V_{14} = V_{cc} - \left\{ \frac{\alpha^3 \cdot I_{21} \cdot r_{34}}{2} + \frac{\alpha^3 \cdot I_{21}(r_{34} + r_{14})}{2} + \quad (9)\right.$$

-continued $$= V_{cc} - \frac{\alpha^3 \cdot I_{21}}{2} \left\{ 2r_{34} + r_{14} + \frac{\alpha I_{22}(r_{34} + r_{14} + r_{24})}{2} \right\}$$

$$= V_{cc} - \frac{\alpha^3 \cdot I_{21}}{2} \left\{ 2r_{34} + r_{14} + \frac{I_{22}}{\alpha \cdot I_{21}} (r_{34} + r_{14} + r_{24}) \right\}$$

Signals $I_{21}$ and $I_{22}$ are currents flowing through the resistors $R_{21}$ and $R_{22}$, and $r_{21}$, $r_{34}$, $r_{14}$ and $r_{24}$ are resistances of the resistors $R_{21}$, $R_{34}$, $R_{14}$ and $R_{24}$, respectively. If the relationship, $I_{22} = \alpha^2 \cdot I_{21}$ may be maintained, where $I_{22}$ is a current flowing through the resistor $R_{22}$, so as to supply a constant current to the (G-Y) matrix, then the equality amount the D.C. potentials $V_{23}$, $V_{14}$ and $V_{13}$ at the three output terminals 23, 14 and 13 may be established (i.e., $V_{23} = V_{13}$) by setting the relationship of resistances in a manner that $3r_{34} + 2r_{14} + r_{24} = r_{23}$. The aforesaid relationship $I_{22} = \alpha^2 I_{21}$ may be maintained by suitably determining the resistance $r_{25}$ of the resistor $R_{25}$ which has been inserted into the base of the transistor $Q_{22}$, as in the case of FIG. 3. Assume that $$r_{25} = (1 + \alpha) I_{21}/I_{22}) \cdot r_{21},$$

and then the equation (6) is substituted thereby, so that $$I_{22}r_{21} = I_{21}r_{21} - (1 - -\alpha)(1 + +\alpha) I_{21}r_{21} \tag{10}$$

Accordingly, $$I_{22} = I_{21} - I_{21} + \alpha^2 I_{21} = \alpha^2 I_{21} \tag{11}$$

Thus, a constant current may be obtained, satisfying the aforesaid prerequisite.

The resistance $$r_{25} = (1 + \alpha)(I_{21}/I_{22}) r_{21} = (1+\alpha)(r_{21}/\alpha^2)$$

thus obtained provides the same results as above, even if $r_{25} = 2r_{21}$. Thus, it suffices to insert the resistor $R_{25}$, whose resistance $r_{25}$ is set to a resistance of $r_{25} = 2r_{21}$, thereby readily achieving the intended objective.

As mentioned above, an output current of a constant current source can be controlled by inserting a resistor between the constant voltage source and the base of the transistor. This results in output potential of a circuit portion, driven by a constant current source, being easily controlled. Similarly the output potentials of other circuit portions, wherein the number of transistors are different from each other and which are driven by respective constant current sources, may be kept equal to each other irrespective of the change in the current gain $\alpha$ due to manufacturing error and/or the fluctuation of the operating temperature. The circuit arrangement to obtain such a result is very simple and is suitable for fabrication with a semiconductor integrated circuit.

Figure 5:
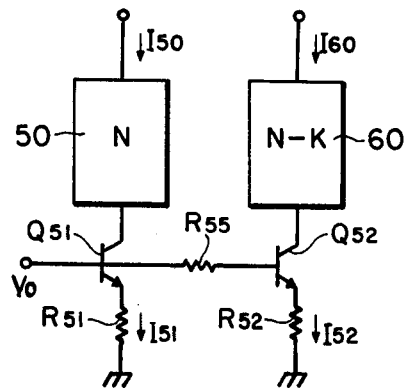
FIG. 5 is a circuit diagram illustrative of the concept of the present invention.

FIG. 5 is a circuit diagram illustrative of the present invention. In FIG. 5, a circuit portion 50, which is a D.C. equivalent to a series connection of transistors of 'N' number, is connected to a constant current source including a transistor $Q_{51}$. In this respect, a differential amplifier consisting of transistors $Q_3$, $Q_4$ of FIG. 3 and a double balanced differential circuit consisting of transistors $Q_{23}$ to $Q_{28}$ of FIG. 4 corresponds to this circuit portion 50, respectively. In FIG. 3, N is equal to 1, and in FIG. 4, N equals 2. Accordingly, a first output current $I_{50}$ from the circuit portion 50 is affected by a base current from 'N' transistors, and thus may be derived as a current proportional to $\alpha^{N+1} \cdot I_{51}$. In the circuit of FIG. 5, another circuit portion 60, which is a D.C. equivalent to the series connection of (N-K) transistors, is connected to another constant current source including a transistor $Q_{52}$. The resistor $R_4$ in FIG. 3 and the series connection of the resistor $R_{14}$, $R_{24}$ and $R_{34}$ in FIG. 4 correspond respectively to the circuit portion 60. In these examples, N-K=0. In order that the second output current $I_{60}$ from the circuit portion 60 is influenced by the base currents of 'N' transistors, under the condition of K=1, the output current from the collector of the transistor $Q_{52}$ has to compensate by the additional resistor $R_{55}$ so as to be influenced by the base currents of 'K' transistors.

The resistance $r_{55}$ of the resistor $R_{55}$ will now be calculated. The relation of the currents $I_{51}$ and $I_{52}$ flowing through the resistors $R_{51}$ and $R_{52}$ can be expressed as follows:

$$r_{51} \cdot I_{51} = r_{55} \cdot (1-\alpha) I_{52} + r_{52} \cdot I_{52} \tag{12}$$

$$\alpha^{N+1} \cdot I_{51} = r_{52}/r_{51} \cdot \alpha^{N-K+1} I_{52} \tag{13}$$

Where $r_{52}$, $r_{52}$ and $r_{55}$ denote the resistances of the resistors $R_{51}$, $R_{52}$ and $R_{55}$, respectively.
From equation (12), $$I_{52} = \frac{r_{51}}{r_{55} \cdot (1-\alpha) + r_{52}} \cdot I_{51} \tag{14}$$

By inserting $I_{52}$ of equation (14) into equation (13), $$\alpha^{N+1} \cdot I_{51} = \frac{r_{52}}{r_{51}} \cdot \alpha^{N-K+1} \cdot \frac{r_{51}}{r_{55} \cdot (1-\alpha) + r_{52}} \cdot I_{51} \tag{15}$$

$$\therefore r_{55} \cdot (1-\alpha) + r_{52} = r_{52} \cdot \alpha^{-K} \tag{16}$$

Therefore, $$r_{55} = \left(\frac{r_{52}}{\alpha^K} - r_{52}\right)/(1-\alpha)$$

$$= \frac{1-\alpha^K}{1-\alpha} \cdot \frac{r_{52}}{\alpha^K}$$

$$= (1 + \alpha + \alpha^2 + \ldots + \alpha^{K-1}) \cdot \frac{r_{52}}{\alpha^K} \tag{17}$$

For instance, in the case where $\alpha = 0.98$ (coresponding to an emitter grounded current gain of 49), from the equation (17), the following results are obtained:
When K=1,
$$r_{55} = (1/\alpha) \, r_{52} = 1.02 \, r_{52}$$

When K=2, $$r_{55} = (1+\alpha/\alpha^2) \, r_{52} = 2.06 \, r_{52}$$

When K=3, $$r_{55} = (1+\alpha+\alpha^2/\alpha^3) \cdot r_{52} = 3.12 \, r_{52}$$

Therefore, it follows that in the range of K=1 to 3 the resistance $r_{55}$ can be practically selected to be about 'K' times as large as the resistance $r_{52}$.

Description has been given thus far of a circuit arrangement, in which compensating resistors $R_5$, $R_{25}$ and $R_{55}$ are inserted in the constant current source, assuming that the resistances $r_1$, $r_{21}$ and $r_{51}$ of the emitter resistors $R_1$, $R_{21}$ and $R_{51}$ are equal to $r_2$, $r_{22}$ and $r_{52}$ of the emitter resistors $R_2$, $R_{22}$ and $R_{52}$. However, it would be apparent from the above calculation that the resistances of the emitter resistors should not necessarily be equal to each other, in contrast to the above embodiments. Generally, the compensating resistor has a function corresponding to the addition of the series connection of transistors to the constant current source. Therefore, in the case where some circuit portions, each having a different number of series connected transistors are driven by the respective constant current sources, the relationship of the respective output currents of these circuit portions can be compensated so as to be equal irrespective of the current gain $\alpha$ of the transistors, by use of the compensating resistor of the invention. In the special case, such as the above embodiments, the output potentials of the plural number of circuit portions can be made equal to each other.

It would be also apparent that, in order to obtain the same result, a plural number of compensating resistors can be inserted in the bases of some constant current sources, rather than into one constant current source.

Although specific embodiments of this invention have been shown and described, it will be understood that various modifications may be made without departing from the spirit of this invention.

I claim:

1. A transistor circuit comprising:
   a power supply terminal;
   a grounding terminal;
   a reference constant voltage supply terminal;
   a first constant current source having a first transistor with a base, an emitter and a collector, said base being connected to said reference constant voltage supply terminal, and a first resistor connected between said emitter of said first transistor and said grounding terminal, thereby generating a first constant current from said collector of said first transistor;
   a first sub-circuit driven by said first constant current generated from said first constant current source; and including a first series connection of N transistors, N being a positive integer of no less than 1, and a first resistive load inserted between said first series connection and said power supply terminal;
   a second constant current source having a second transistor with a base, an emitter and a collector, a second resistor connected between said emitter and said grounding terminal, and a compensating resistor inserted between said reference constant voltage supply terminal and said base, thereby generating a second constant current from said collector of said second transistor, said compensating resistor having a resistance K times as large as the resistance of said second resistor, where k is a positive integer between 1 and N, and
   a second sub-circuit driven by said second constant current generated from said second constant current source and including a second series connection of (N-K) transistors and a second resistive load inserted between one end of said second series connection and said power supply terminal, the voltage drop across said second resistive load being approximately the same value as the voltage drop across said first resistive load.

2. A transistor circuit in accordance with claim 1, wherein said first resistor and said second resistor have the same resistance and said first resistive load and said second resistive load are resistors of the same resistance value.

3. A transistor circuit in accordance with claim 1, wherein said number K of said second series connection is an integer between 1 and 3 and said compensating resistor has a resistance being K times as large as the resistance of said second resistor.

4. A transistor circuit in accordance with claim 2, wherein said number K of said second series connection is an integer between 1 and 3 and said compensating resistor has a resistance being K times as large as the resistance of said second resistor.

5. A transistor circuit comprising:
   a power supply terminal,
   a reference voltage supply terminal,
   a common potential terminal,
   a first constant current source having a first transistor with a base, an emitter and a collector, said base being connected to said reference voltage supply terminal, and a first resistor connected between said emitter of said first transistor and said common potential terminal,
   a second constant current source having a second transistor with a base, an emitter and a collector, and a second resistor connected between said emitter of said second transistor and said common potential terminal,
   a first circuit portion having a series connection of a first load means and a third transistor, and being connected betweeen said power supply terminal and said first constant current source,
   a second circuit portion having a second load means and being connected between said power supply terminal and said second constant current source, and
   a third resistor connected between said reference voltage supply terminal and said base of said second transistor, said third resistor having a resistance K times a lage as the resistance of said second load means, thereby generating a D.C. voltage drop across said second load means, said D.C. voltage drop having approximately the same value as the voltage drop across said first load means.

6. A transistor circuit in accordance with claim 5, wherein said first circuit portion further includes at least one transistor connected in series between said third transistor and said first constant current source.

7. A transistor circuit in accordance with claim 6, wherein said second circuit portion further includes at least one transistor connected in series between said second load means and said second constant current source, the number of series connected transistors in said second circuit portion being less than the number of series-connected transistors in said first circuit portion.

* * * * *